US008774734B1

(12) United States Patent
Rich et al.

(10) Patent No.: US 8,774,734 B1
(45) Date of Patent: Jul. 8, 2014

(54) MODULE THAT CAN BE USED AS A PLUG-IN MODULE AND AS A SOLDER-DOWN MODULE

(75) Inventors: Mark Rich, Menlo Park, CA (US); Dieter Statezni, Santa Clara, CA (US); Michael Green, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 659 days.

(21) Appl. No.: 12/830,174

(22) Filed: Jul. 2, 2010

(51) Int. Cl.
*H04B 1/38* (2006.01)
*H04B 1/40* (2006.01)

(52) U.S. Cl.
CPC .................................... *H04B 1/40* (2013.01)
USPC ................... 455/73; 455/226.1; 455/67.11

(58) Field of Classification Search
CPC ............. H01L 2924/00; H01L 2924/00014; H01L 2224/45014; H01L 2924/00013; H01L 2224/45015; H01L 2224/85205; H01L 2224/29099; H01L 2224/45124; H01L 2224/45139; H01L 1/0026; H04W 24/00; H04W 24/08; H04B 17/0042; H04B 17/0057
USPC ......... 455/73–88, 67.11–67.16, 226.1–226.4, 455/557; 324/750.02–762.01
See application file for complete search history.

(56) References Cited

U.S. PATENT DOCUMENTS

| 5,454,725 | A  | * | 10/1995 | Speiser et al. .................. 439/61 |
| 6,618,268 | B2 | * | 9/2003 | Dibene et al. ................. 361/787 |
| 6,864,700 | B2 | * | 3/2005 | Mess ........................ 324/754.18 |
| 7,354,275 | B2 |   | 4/2008 | Chuang et al. |
| 7,403,397 | B2 | * | 7/2008 | Matsumoto et al. .......... 361/792 |
| 7,405,573 | B2 | * | 7/2008 | Cuevas ........................ 324/539 |
| 7,528,008 | B2 | * | 5/2009 | Fjelstad ................ 257/E23.021 |
| 7,840,201 | B2 | * | 11/2010 | Nishimura et al. ......... 455/189.1 |
| 2003/0157959 | A1 | * | 8/2003 | Makela et al. ................ 455/556 |
| 2005/0018410 | A1 | * | 1/2005 | Brandenburg et al. ....... 361/782 |
| 2006/0183422 | A1 | * | 8/2006 | Defosse et al. ............. 455/41.1 |
| 2009/0237895 | A1 | * | 9/2009 | Cole et al. ..................... 361/749 |
| 2011/0240347 | A1 | * | 10/2011 | Mantel et al. ................. 174/257 |
| 2012/0224296 | A1 | * | 9/2012 | Hardin et al. .............. 361/301.4 |

* cited by examiner

*Primary Examiner* — Lana N Le
(74) *Attorney, Agent, or Firm* — Holland & Hart LLP

(57) ABSTRACT

A modular device includes a first printed circuit board and a wireless transceiver (e.g., a radio). Electrical connectors (e.g., pads) are located along multiple edges of the first printed circuit board. The electrical connectors are in locations that correspond to a land pattern on a second printed circuit board. Along one edge of the first printed circuit board, the electrical connectors also correspond to electrical connections in a socket. For certification testing, for example, the device can be plugged into a socket. For installation in a host device, the device can be soldered down to the second printed circuit board.

17 Claims, 5 Drawing Sheets

MODULE THAT CAN BE USED AS A PLUG-IN MODULE AND AS A SOLDER-DOWN MODULE

BACKGROUND

For wireless communication, a laptop or notebook computer system may include a module that incorporates a radio. The module is typically embodied as a printed circuit board or card on which the radio and other components such as a crystal oscillator, a power supply, and calibration memory are mounted. One end of the card is plugged into a socket on a motherboard, for example, and the opposite end is held in place using a retainer.

Each wireless communication module design is certified by regulatory agencies such as the Federal Communications Commission (FCC) in the United States and similar agencies in other parts of the world. Conformance tests are performed on representative samples of a module to certify the design. Once a design is certified, the manufacturers test the mass-produced modules to make sure they comply with the certified design.

Wireless communication modules of the type just described are high volume commodities. For competitive reasons, it is desirable to reduce their cost and size. However, the need to perform regulatory certification testing and subsequent manufacturing tests limits the types of things that can be done to reduce cost and size.

SUMMARY

One way to reduce cost and size is to eliminate the socket and retainer mentioned above. These elements not only contribute significantly to the total cost of the wireless communication module but may also be nearly as large as the module itself. However, without a socket and retainer, an alternative mechanism is needed to hold the module in place. Whatever mechanism is used must lend itself to the requisite manufacturing and calibration tests and must meet the conditions to qualify for modular approval by regulatory agencies.

According to an embodiment of the invention, a modular device includes a first printed circuit board on which a wireless transceiver (e.g., a radio) is mounted. Electrical connectors (e.g., pads) are located along multiple edges of the first printed circuit board. The electrical connectors (edge connectors) are in locations that correspond to a land (e.g., pad) pattern on a second printed circuit board (e.g., a motherboard). Along one edge of the first printed circuit board, the electrical connectors also correspond to electrical connections in a socket. In one embodiment, the electrical connectors along that edge are configured as power and ground connections and to receive selected signals via the socket during testing of the module. Thus, for regulatory certification and manufacturing testing, the module can be conveniently plugged into a socket. For installation in a host system such as a laptop or notebook computer system, the module can be soldered down to the second printed circuit board.

Accordingly, the inventive device qualifies as a module so that it can be tested and certified outside of a host system (outside a laptop or notebook, for example), providing the ability to homologate the module and meet the regulatory requirements for modular approval. Regulatory agencies require such a device to be tested independently, outside of the host device in order to qualify for modular certification. The inclusion of the aforementioned edge connector enables conformance testing to be performed according to the required conditions for modular certification. That is, the module can be certified as a modular device by plugging it into a socket for certification testing and, once certified, mass-produced modules can also be plugged into a socket for testing to demonstrate they comply with the certified design. Suppliers of host devices and systems (e.g., motherboard, laptop, and notebook manufacturers and vendors) are then able to purchase and use a preapproved module that can be readily installed in different types of devices and systems. The ability to solder down the certified module reduces overall cost and size by eliminating the relatively large and costly socket and retainer elements. The ability to solder down the module while also facilitating certification and manufacturing tests means that the electrical contacts do not need to be located along only a single edge of the module as in conventional designs. Thus, the size of the module is also reduced by placing the electrical contacts along multiple edges of the module.

In other words, in sum, the inventive module achieves synergy between size, cost, certification testing, manufacturing/compliance testing, modularity, and installability.

These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of this disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Figure 1:
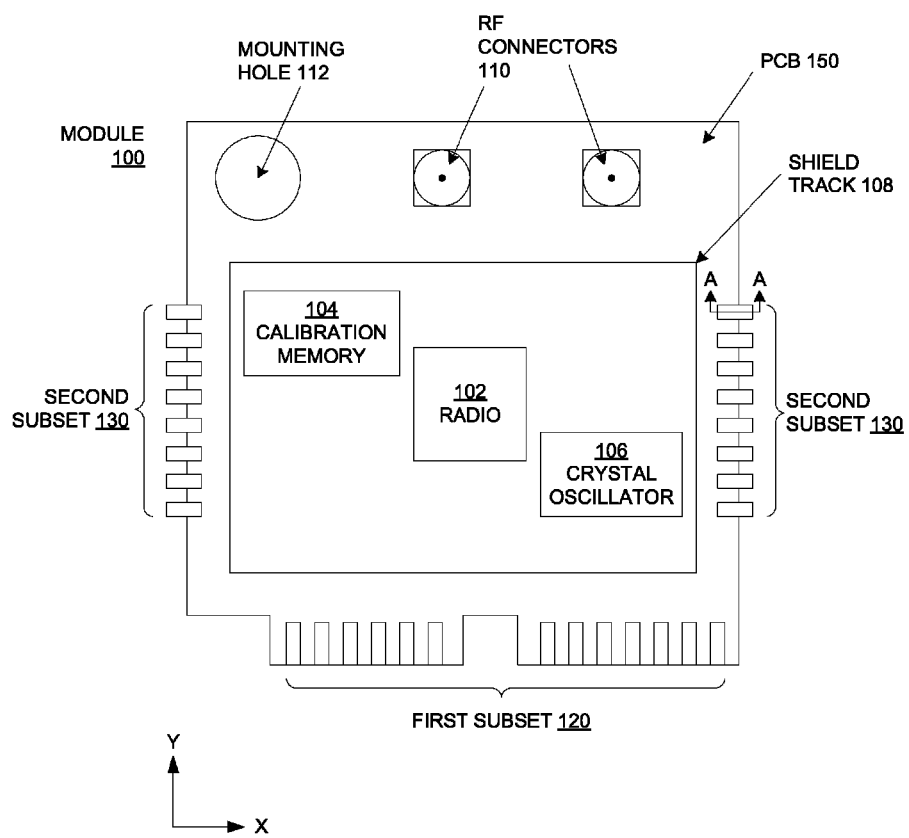
FIG. 1 illustrates an example of a module in an embodiment according to the present invention.

FIG. 1 illustrates an embodiment of a module 100 in accordance with the present invention. In one embodiment, the module 100 is implemented as a printed circuit board (PCB) 150 or card on which a variety of components are mounted. The PCB 150 may also be referred to herein as the first PCB.

In general, the module 100 can be any type of module that is tested or operated in some other manner before it is more permanently installed in or on a host device or system. In the example of FIG. 1, the module 100 is a wireless communication module that can be subjected to certification testing or manufacturing (compliance, calibration) testing before it is installed on a host device (e.g., another PCB such as a motherboard) or in a host system (e.g., a laptop or notebook computer system).

In the FIG. 1 embodiment, the module 100 includes a radio 102, a calibration memory 104, and a crystal oscillator 106 that are mounted within a shield track 108. The module 100 also includes a number of radio frequency (RF) connectors 110 and a single mounting hole 112.

The module 100 may include components other than or in addition to those shown and described herein. However, in one embodiment, the module 100 does not include a power supply, specifically a 1.2 volt (V) power supply. In such an embodiment, the module 100 receives the 1.2 V power supply, as well as a 3.3 V power supply, from the host device (e.g., a second PCB or motherboard) on which the module is mounted.

A first subset 120 of electrical connectors (or surface-mounted pads, or pins) is located along one edge of the module 100 as shown. In addition to the first subset 120 of pins, a second subset 130 of electrical connectors (or pads or pins) is located along at least one other edge of the module 100. In general, the electrical connectors (pads, pins) constitute solderable surfaces.

In the example of FIG. 1, the electrical connectors that constitute the second subset 130 are located along two edges of the module 100. Alternatively, electrical connectors that constitute the second subset 130 may be placed along a single edge of the module, or along all edges of the module.

The radio 102, calibration memory 104, crystal oscillator 106, and electrical connectors 120 and 130 define the active area of the module 100. In one embodiment, the active area measures approximately 21 millimeters (mm) by 24 mm, with the shorter dimension measured along the x-axis in the orientation of FIG. 1. Thus, the module 100 provides a significant reduction in size relative to similar types of conventional modules, which may have an active area of approximately 30 mm by 24 mm.

In one embodiment, the first subset 120 includes 34 pins; in another embodiment, the number of pins in the first subset 120 is limited to 17 for design for manufacturability (DFM) purposes. In one embodiment, the module 100 is compliant with the Peripheral Component Interconnect Express (PCIe) industry standard, in which case the module 100 may be referred to as a PCIe Mini Card or, more precisely, a PCIe half-Mini Card. Conventionally, a PCIe card includes 52 pins along the edge that is plugged into a socket. Thus, relative to a conventional PCIe card, the module 100 utilizes fewer pins along the edge that can be plugged into a socket. However, in a PCIe embodiment, the module 100 remains compliant with the PCIe standard, as will be seen from the discussion to follow.

The locations of the pins in the first subset 120 correspond to electrical connections in a socket. Thus, for certification tests as well as for subsequent tests (e.g., manufacturing, compliance, and/or calibration tests), the module 100 can be plugged into a socket using the first subset 120 of pins. The locations of the pins in the first subset 120 also correspond to a land (pad) pattern on a host device (e.g., a second PCB or motherboard). That is, the locations of the pins in the first subset 120 correspond to both the land pattern on the host device and the electrical connections in a socket. Thus, the pins in the first subset 120 can be soldered to the pads on the host device in order to mount the module 100 on the first device.

The locations of the pins in the second subset 130 correspond to a land pattern on a host device (e.g., a second PCB or motherboard). As mentioned above, the locations of the pins in the first subset 120 also correspond to a land pattern on the host device. Thus, the module 100 can be attached (e.g., soldered down) to the host device using both the first and second subsets 120 and 130 of pins.

In a conventional PCB or module, the function of each electrical connector is assigned in a well known manner; for example, each pin may be assigned a particular function according to the PCIe standard. However, according to an embodiment of the present invention, the functionality of the various electrical connectors included in the first subset 120 is defined in a manner that accommodates the required level of certification testing as well as the subsequent manufacturing/compliance testing. That is, the pin assignments for the first subset 120 of electrical connections may be different from standard pin assignments. In one embodiment, the electrical connectors in the first subset 120 are configured as power and ground connections and to receive selected bus signals. The selected bus signals, in general, include the minimum set of signals needed for certification and subsequent manufacturing testing.

As just noted, the pin assignments for the first subset 120 of electrical connections may be different from standard pin assignments, and the number of pins in the first subset 120 may be less than the standard number of pins. The second subset 130 of pins reconciles those differences. In other words, the combination of the first and second subsets 120 and 130 of pins provides the functionality of a conventional/standard set of pins. In one embodiment, pins in the second subset 130 are configured as power and ground connections and to receive general purpose input/output (GPIO) signals from the host device.

In a PCIe embodiment, for example, although the pinout for the module 100 may be different from that described in the PCIe standard, the various pin assignments described in the PCIe standard are included in the module 100. Thus, in a PCIe embodiment, for example, the module 100 is compatible with the PCIe standard.

To summarize, the first subset 120 pins can be plugged into a socket and can be used during certification, manufacturing, compliance, and calibration testing. When the module 100 is soldered to a host device, both the first subset 120 and the second subset 130 of pins can be used.

Figure 2:
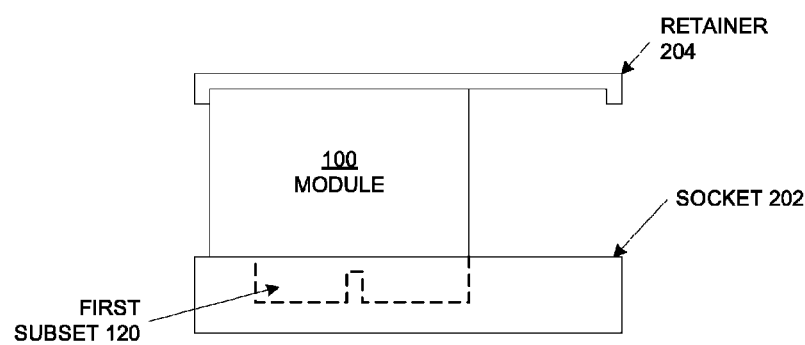
FIG. 2 illustrates an example of a module inserted into a socket in an embodiment according to the present invention.

For test purposes or for other purposes, the module 100 (more precisely, the first subset 120 of electrical connectors) can be inserted (plugged) into a socket 202 as shown in FIG. 2. The socket 202 can be a legacy or conventional type of socket. A retainer 204, which may be a legacy or conventional type of retainer, can be used to hold the module 100 in place. After testing is completed, the module 100 can be removed from the socket and retainer.

Figure 3:
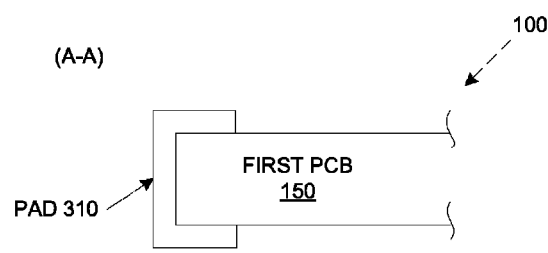
FIG. 3 is a cross-sectional view of an electrical connection formed on a module in an embodiment according to the present invention.

FIG. 3 is a cross-sectional view of an electrical connection (or pad or pin) 310 on the module 100 according to an embodiment of the invention. The pad 310 is representative of any of the electrical connections in the first and second subsets 120 and 130 of FIG. 1.

In the FIG. 3 embodiment, the pad 310 wraps around the edge of the PCB 150. Wrapping the pads around the edge of the PCB 150 facilitates soldering of the pads to a host device (e.g., a second PCB or motherboard).

Figure 4:
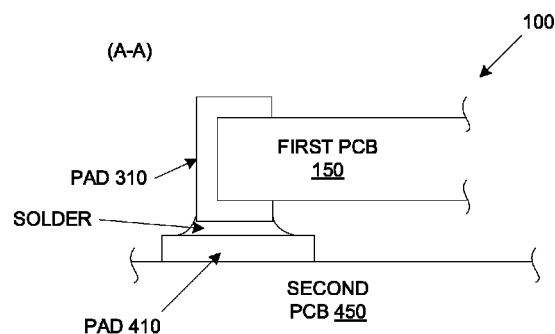
FIG. 4 is a cross-sectional view of a module attached to a host device in an embodiment according to the present invention.

FIG. 4 is a cross-sectional view in which the module 100 is soldered to a host device—for example, a second PCB 450 or motherboard—according to an embodiment of the invention. In the example of FIG. 4, the pad 310 is soldered to a corresponding pad 410 on the second PCB 450.

As shown in the example of FIG. 1, the electrical connections are located along multiple edges of the module 100. Thus, in such an embodiment, the module 100 can be soldered to the second PCB 450 along multiple edges for mechanical stability. Thus, the module 100 can be rigidly and securely attached to the second PCB 450.

When installed in a host device—e.g., when soldered to a motherboard—the module 100 consumes an area of about 21 mm by 27 mm. In contrast, a conventional module installed with a socket and retainer consumes an area of about 31.5 mm by 37 mm. Thus, the module 100 consumes significantly less board area relative to similar types of conventional modules.

Figure 5:
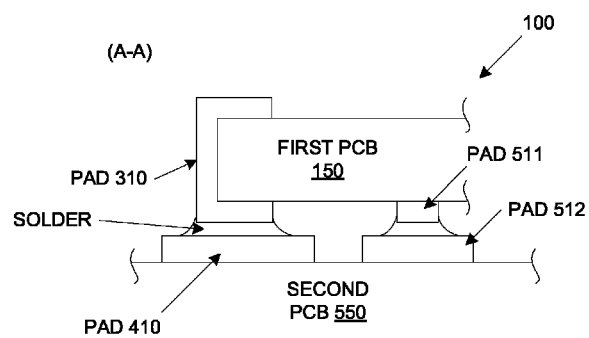
FIG. 5 is a cross-sectional view of a module attached to a host device in an embodiment according to the present invention.

FIG. 5 is a cross-sectional view in which the module 100 is soldered to a host device—for example, a second PCB 550 or motherboard—according to another embodiment of the invention. In the example of FIG. 5, the pad 310 is soldered to a corresponding pad 410 on the second PCB 550 as described above. However, in this embodiment, the module 100 includes another pad 511 that is located on the surface of the first PCB 150 but not on the edge of the first PCB 150. The pad 511 can be soldered to a corresponding pad 512 on the second PCB 550. The pad 410 and the pad 512 may be part of the same land pattern, or they may be parts of different land patterns.

Figure 6:
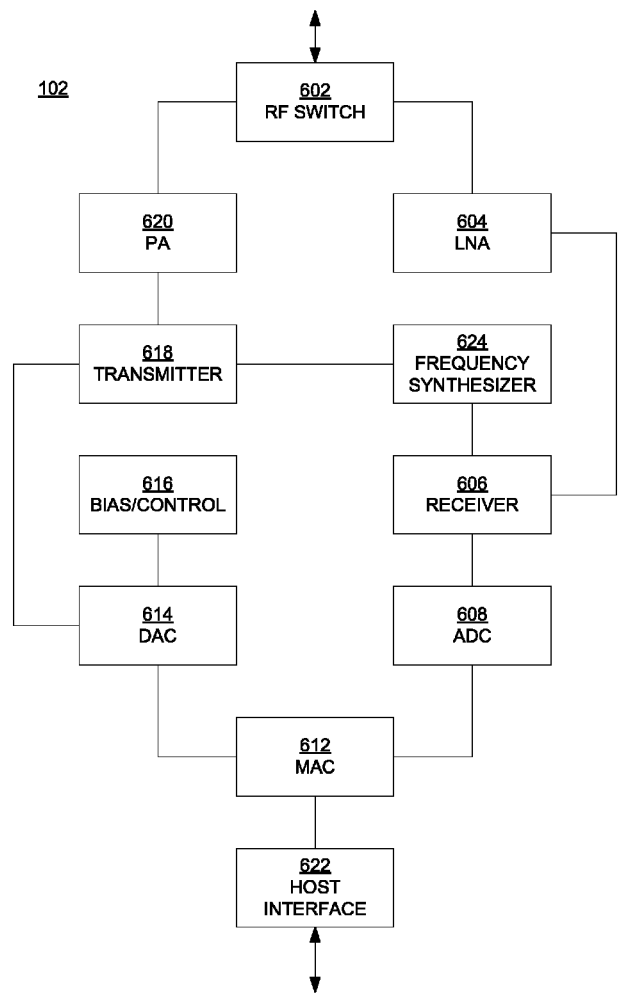
FIG. 6 is a block diagram of an example of a radio that may be used with embodiments according to the present invention.

FIG. 6 is a block diagram of an example of a radio 102 according to an embodiment of the invention. In the example of FIG. 6, on the receiving path, the radio 102 includes an RF switch 602, a low noise amplifier (LNA) 604, a receiver 606, an analog-to-digital converter (ADC) 608, and a media access controller (MAC) 612 coupled to a host interface 622. A frequency synthesizer 624 allows the radio to be tuned to a desired frequency. On the transmitting path, the radio 102 includes the MAC 612, a digital-to-analog converter (DAC) 614, bias/control 616, a transmitter 618, a power amplifier (PA) 620, and the RF switch 602.

Figure 7:
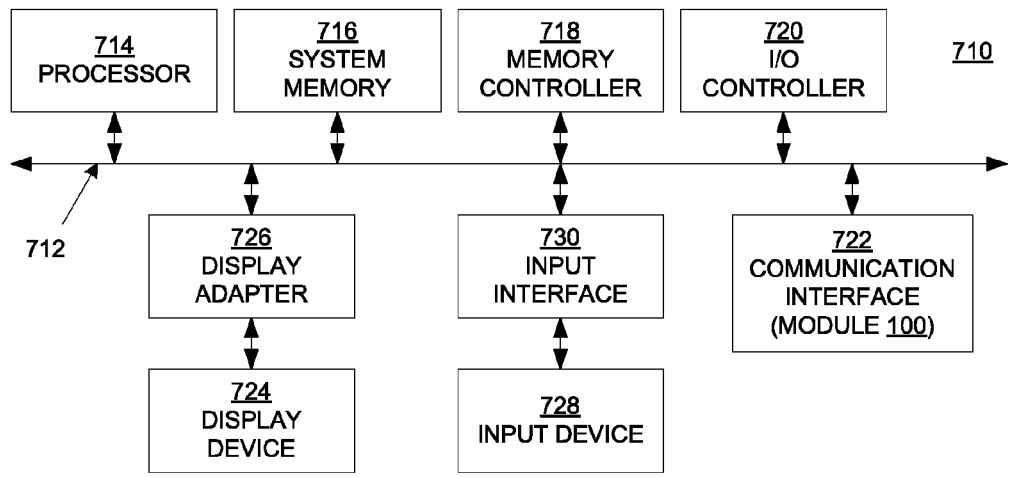
FIG. 7 is a block diagram of an example of a host system that may be used with embodiments according to the present invention.

FIG. 7 is a block diagram of an example of a host system 710 upon which embodiments according to the invention may be implemented. The system 710 broadly represents any single or multi-processor computer system. Examples of the system 710 include, without limitation, workstations, laptops, notebooks, desktops, client-side terminals, servers, distributed computing systems, handheld devices, or any other computing system or device.

In its most basic configuration, the system 710 may include at least a processor 714 and a system memory 716. Examples of a system memory 716 include, without limitation, random access memory (RAM), read only memory (ROM), flash memory, or any other suitable memory device.

In the embodiment of FIG. 7, the system 710 includes a memory controller 718, an input/output (I/O) controller 720, and a communication interface 722, each of which may be interconnected via a communication infrastructure 712. Examples of the communication infrastructure 712 include, without limitation, a communication bus (such as an Industry Standard Architecture (ISA), PCI, PCIe, or similar bus). Examples of the communication interface 722 include, without limitation, a wireless interface such as the module 100 of FIG. 1.

As illustrated in FIG. 7, the system 710 may also include a display device 724 coupled to the communication infrastructure 712 via a display adapter 726. The system 710 may also include at least one input device 728 coupled to the communication infrastructure 712 via an input interface 730. Examples of the input device 728 include, without limitation, a keyboard, a pointing device (mouse), or a speech recognition device.

Figure 8:
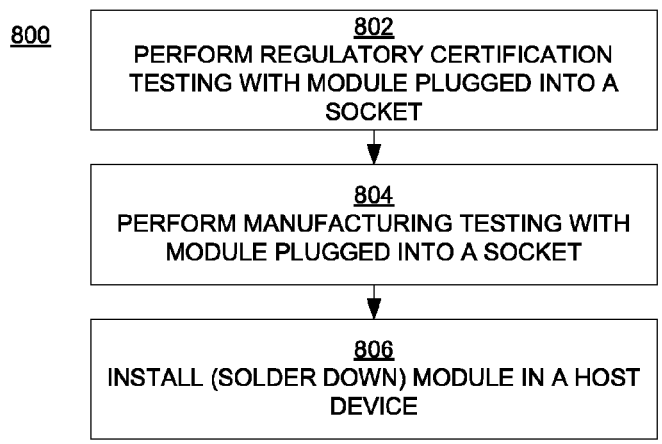
FIG. 8 is a flowchart of a method for modular certification/homologation of a module in an embodiment according to the present invention.

FIG. 8 is a flowchart 800 of a method for modular certification/homologation of a product such as the module 100 of FIG. 1 according to an embodiment of the invention. In block 802, regulatory certification testing of the module 100 is performed by plugging the module into a socket.

In block 804, after the module is certified, manufacturing testing of the mass-produced versions of the module 100 is performed by plugging each module to be tested into a socket. Other manufacturing tests may be performed for purposes of quality assurance, for example, or to calibrate each module. After testing, the module can be unplugged from the socket.

In block 806, a module 100 can be installed onto or into a host device. More specifically, the module 100 can be soldered to a host device (e.g., a motherboard), which in turn can be installed in a host system such as a laptop or notebook computer system.

In summary, according to embodiments of the invention, a module—specifically, a wireless (radio) communication module—occupies less PCB area and allows use of standard sockets for homologation/regulatory certification testing, manufacturing tests, and calibration. More specifically, the module can be calibrated and tested in a socket. The module can then be soldered directly to a host device (e.g., motherboard), eliminating the need for a socket and retainer.

Thus, the module can be built, tested, and even installed as a plug-in module and can also be used as a solder-down device. The module advantageously satisfies regulatory requirements to qualify for modular certification by including a socket (e.g., PCIe) interface in addition to the solder-down type of interface. A solution that included only a solder-down type of interface would not be eligible for modular certification and the associated benefits.

The inventive module thus provides the ability to homologate a product while meeting the regulatory requirements for modular approval. This removes the regulatory burden from suppliers and vendors, because end products (e.g., host systems such as laptops and host devices such as motherboards) do not need to go through separate regulatory approval for the module because the module is already test and certified.

In the foregoing specification, embodiments have been described with reference to numerous specific details that may vary from implementation to implementation. Thus, the sole and exclusive indicator of what is the invention, and is intended by the applicant to be the invention, is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A device comprising:
a first printed circuit board;
a wireless transceiver mounted on said first printed circuit board; and
a plurality of electrical connectors located along multiple edges of said first printed circuit board, wherein said electrical connectors are wrapped around said edges in locations that correspond to a land pattern on a second printed circuit board, wherein said plurality of electrical connectors includes a first subset of electrical connectors located along a single one of the multiple edges of said first printed circuit board, wherein said first subset of electrical connectors are positioned in locations that correspond to locations of electrical connections in an external socket used for testing the device, wherein the first subset of electrical connectors carry all signals required for testing the device.

2. The device of claim 1 wherein the first subset of electrical connectors are configured as power and ground connections and to receive selected signals via said external socket during testing of said device.

3. The device of claim 1 wherein electrical connectors along said single edge are configured to receive signals from said second printed circuit board, and wherein electrical connectors along other edges of said first printed circuit board are configured as power and ground connections and to receive general purpose input/output (GPIO) signals from said second printed circuit board.

4. The device of claim 1 wherein said plurality of electrical connectors are soldered to said second printed circuit board so that said first printed circuit board is attached to said second printed circuit board along said multiple edges.

5. The device of claim 1 comprising an active area of not greater than approximately 21 mm by 24 mm.

6. The device of claim 1, wherein said plurality of electrical connectors includes less than 52 pins.

7. The device of claim 1 wherein said first printed circuit board includes a single mounting hole.

8. The device of claim 1 wherein pinout said electrical connectors is compatible with the Peripheral Component Interface Express (PCIe) standard.

9. The device of claim 1, further comprising at least one pad located on a surface of the first printed circuit board, wherein the at least one pad is not wrapped around said edges of said first printed circuit board, wherein said at least one pad is in a location that corresponds to the land pattern on the second printed circuit board.

10. The device of claim 1, wherein the single one of the multiple edges of the first printed circuit board is configured to be fitted into the external socket, such that said first subset of electrical connectors are placed into contact with the electrical connections in the external socket.

11. A system comprising:
a processor;
a memory coupled to said processor;
a display device coupled to said processor; and
a wireless communication module coupled to said processor and comprising a plurality of electrical connectors located along multiple edges of a first printed circuit board, wherein said electrical connectors are positioned around said edges in positions that correspond to a land pattern on a second printed circuit board, and wherein said plurality of electrical connectors comprise a first subset of electrical connectors located along a single one of the multiple edges of said first printed circuit board, wherein said first subset of electrical connectors are positioned in locations that correspond to locations of electrical connections in an external socket used for testing the wireless communication module, wherein the first subset of electrical connectors carry all signals required for testing the wireless communication module.

12. The system of claim 11 wherein said first subset of electrical connectors are configured to receive power and ground connections and selected signals via the external socket during testing of said device.

13. The system of claim 12 wherein said plurality of electrical connectors comprise electrical connectors in positions along a single edge of said first printed circuit board, wherein said electrical connectors along said single edge are configured to receive signals from said second printed circuit board, and wherein electrical connectors along other edges of said first printed circuit board are configured as power and ground connections and to receive general purpose input/output (GPIO) signals from said second printed circuit board.

14. The system of claim 13 wherein said electrical connectors are soldered to said second printed circuit board so that said first printed circuit board is attached to said second printed circuit board along said multiple edges.

15. The system of claim 14 wherein said wireless communication module comprises an active area of not greater than approximately 21 mm by 24 mm, and wherein said plurality of electrical connectors includes less than 52 pins.

16. The system of claim 15, further comprising at least one pad located on a surface of the first printed circuit board, wherein the at least one pad is not wrapped around said edges of said first printed circuit board, wherein said at least one pad is in a location that corresponds to the land pattern on the second printed circuit board.

17. The system of claim 16, wherein the single one of the multiple edges of the first printed circuit board is configured to be fitted into the external socket, such that said first subset of electrical connectors are placed into contact with the electrical connections in the external socket.

* * * * *